(12) United States Patent
Park et al.

(10) Patent No.: US 9,467,174 B2
(45) Date of Patent: Oct. 11, 2016

(54) LOW COMPLEXITY HIGH-ORDER SYNDROME CALCULATOR FOR BLOCK CODES AND METHOD OF CALCULATING HIGH-ORDER SYNDROME

(71) Applicant: Samsung Electronics Co., Ltd., Suwon-si (KR)

(72) Inventors: Chang Soon Park, Chungju-si (KR); Hyo Sun Hwang, Seoul (KR); Young Jun Hong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 131 days.

(21) Appl. No.: 14/500,803

(22) Filed: Sep. 29, 2014

(65) Prior Publication Data

US 2015/0263764 A1 Sep. 17, 2015

(30) Foreign Application Priority Data

Mar. 14, 2014 (KR) .................... 10-2014-0030490
Jul. 16, 2014 (KR) .................... 10-2014-0089739

(51) Int. Cl.
*H03M 13/15* (2006.01)
*H04L 27/26* (2006.01)
(Continued)

(52) U.S. Cl.
CPC ....... *H03M 13/159* (2013.01); *H03M 13/1545* (2013.01); *H03M 13/1595* (2013.01);
(Continued)

(58) Field of Classification Search
CPC ......... H03M 13/1595; H03M 13/159; H03M 13/1545; H04L 27/2626; H04L 25/03872; H04L 7/0029; H04L 25/03343
USPC ....................... 714/785, 752, 784
See application file for complete search history.

(56) References Cited

U.S. PATENT DOCUMENTS

| 5,600,582 A * | 2/1997 | Miyaguchi .......... G06F 15/8092 708/300 |
| 6,597,745 B1 * | 7/2003 | Dowling ........... H04L 25/03343 375/240.18 |

(Continued)

FOREIGN PATENT DOCUMENTS

| JP | 5-224967 A | 9/1993 |
| JP | 7-254860 A | 10/1995 |

(Continued)

OTHER PUBLICATIONS

Sukhavasi et al., A Primitive Polynomial to Define the Finite Field Modules for High-Throughput Interpolator to Encode and Decode of Non Binary Cyclic Codes, Jul.-Aug. 2012, International Journal of Modern Engineering Research (IJMER), vol. 2, Issue.4, pp. 2938-2946.*

(Continued)

*Primary Examiner* — John J Tabone, Jr.
(74) *Attorney, Agent, or Firm* — NSIP Law

(57) ABSTRACT

A high-order syndrome calculator includes a serial-to-parallel converter configured to convert serial bit sequences received from a transmitter to a parallel multi-stream, an exclusive OR (XOR) operator configured to perform an XOR operation on bit values of the multi-stream, a zero interpolator configured to insert zero values between the bits on which the XOR operation is performed, and a linear feedback shift register configured to calculate a high-order syndrome value based on a coefficient of a remainder obtained by dividing, by a primitive polynomial, a polynomial generated from the multi-stream in which the zero values are inserted.

15 Claims, 12 Drawing Sheets

(51) Int. Cl.
  *H04L 25/03* (2006.01)
  *H04L 7/00* (2006.01)
(52) U.S. Cl.
  CPC ....... *H04L 7/0029* (2013.01); *H04L 25/03343* (2013.01); *H04L 25/03872* (2013.01); *H04L 27/2626* (2013.01)

(56) References Cited

U.S. PATENT DOCUMENTS

| | | | | |
|---|---|---|---|---|
| 8,416,019 | B2* | 4/2013 | Moses | H03G 1/0088 330/131 |
| 2003/0140302 | A1* | 7/2003 | Litwin, Jr. | G11B 20/10296 714/784 |
| 2008/0080598 | A1* | 4/2008 | Mo | H04L 27/0008 375/219 |
| 2008/0133630 | A1* | 6/2008 | Bang | H03H 17/0657 708/313 |

FOREIGN PATENT DOCUMENTS

| | | |
|---|---|---|
| JP | 2874933 B2 | 1/1999 |
| JP | 2001-136078 A | 5/2001 |
| JP | 3223513 B2 | 8/2001 |
| JP | 2006-340205 A | 12/2006 |
| JP | 2008-112522 A | 5/2008 |
| KR | 1998-041383 A | 8/1998 |
| KR | 10-0192803 B1 | 6/1999 |
| KR | 10-0212829 B1 | 8/1999 |
| KR | 10-2004-0041294 A | 5/2004 |
| WO | WO 85/01625 A1 | 4/1985 |

OTHER PUBLICATIONS

L. Li, "Linear-feedback shift registers for encoding and decoding cyclic codes," Section 4 of *Notes to Error Control Code*, Apr. 1, 2007, notes for undergraduate students majoring in telecommunications, College of Mathematics, Science, and Information, Shanghai Normal University (SHNU), Shanghai, China (19 pages, in English).

S. Haykin, *Communications Systems*, 4th Edition, 2001, John Wiley & Sons, Inc. (entire book, 838 pages).

X. Zhang et al., "Interpolation-based Hard-decision Reed-Solomon Decoders," *Proceedings of the 12th International Symposium on Integrated Circuits (ISIC 2009)*, Dec. 2009, pp. 175-178, conference held Dec. 14-16, 2009, Singapore.

\* cited by examiner

FIG. 11

|  | Conventional method | Disclosed method |
|---|---|---|
| Number of multiplications | n | 0 |
| Number of modulo operations | n | 0 |
| Number of bits in registers for storing information | m x n | m |
| Number of function calls for searching an output | n (selecting one among n vectors) | 0 |
| Number of XOR operations | m x n | (L-1)x(n/L)+m'xn |

$m'(\leq m)$ : number of nonzero coefficients of primitive polynomial $f(x)-1$

FIG. 12

|  | Conventional method | Disclosed method |
|---|---|---|
| Number of multiplications | 63 | 0 |
| Number of modulo operations | 63 | 0 |
| Number of bits in registers for storing information | 6 x 63 = 378 | 6 |
| Number of function calls for searching an output | 63 | 0 |
| Number of XOR operations | 6 x 63 = 378 | 42+126 = 168 |

LOW COMPLEXITY HIGH-ORDER SYNDROME CALCULATOR FOR BLOCK CODES AND METHOD OF CALCULATING HIGH-ORDER SYNDROME

CROSS-REFERENCE TO RELATED APPLICATIONS

This application claims the benefit under 35 USC 119(a) of Korean Patent Application No. 10-2014-0030490 filed on Mar. 14, 2014, and Korean Patent Application No. 10-2014-0089739 filed on Jul. 16, 2014, in the Korean Intellectual Property Office, the entire disclosures of which are incorporated herein by reference for all purposes.

BACKGROUND

1. Field

The following description relates to a high-order syndrome calculator configured to calculate a high-order syndrome at a low complexity for a block code and a method of calculating a high-order syndrome.

2. Description of Related Art

A block code is a code widely used among error correcting codes. Examples of the block code include a Hamming code capable of performing error correction on a single bit, a Bose-Chaudhuri-Hocquenghem (BCH) code capable of performing error correction on a plurality of bits, and a Reed-Solomon (RS) code capable of treating a plurality of bits as a single symbol and correcting an error based on a symbol unit.

The block code increases a complexity in the case of decoding rather than in the case of encoding. When a reception error occurs, the BCH code or the RS code configured to correct an error based on a plurality of bits or a symbol unit may have an excellent efficiency compared to the Hamming code having an error correcting capability for a single bit, but increase a calculation complexity.

In a low power transmitter and receiver, a power of a transmission signal may be relatively low, and thus a communication reliability between the transmitter and the receiver may be degraded. A communication system may require a low complexity calculation when applying an error correcting code. For example, small sensors used for a variety of wireless sensor networks and near field communication systems generally require a calculation that uses low power and low complexity.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a high-order syndrome calculator includes a serial-to-parallel converter configured to convert serial bit sequences received from a transmitter to a parallel multi-stream; an exclusive OR (XOR) operator configured to perform an XOR operation on bit values of the multi-stream; a zero interpolator configured to insert zero values between the bits on which the XOR operation is performed; and a linear feedback shift register configured to calculate a high-order syndrome value based on a coefficient of a remainder obtained by dividing, by a primitive polynomial, a polynomial generated from the multi-stream in which the zero values are inserted.

The serial-to-parallel converter may be further configured to convert the received serial bit sequences to an L-bit multi-stream, L denoting a natural number satisfying $L \geq 1$, by delaying the received serial bit sequences by integer multiples of a predetermined number of bits satisfying the equation $D=n/j$, where D denotes the predetermined number of bits, n denotes a block size of a block code, j denotes a syndrome order to be calculated, and $n/j$ denotes an integer.

The serial-to-parallel converter may include (L−1) delay elements, and may be further configured to output a bit sequence as a first bit of the multi-stream without delaying the bit sequence, and output the bit sequence as an Lth bit of the multi-stream after delaying the bit sequence by (L−1)×D bits.

The serial-to-parallel converter may be further configured to output the received serial bit sequences to the zero interpolator without delaying the received serial bit sequences in response to a value of $n/j$ not being an integer.

The zero interpolator may be further configured to periodically insert N (=j−1) zero values between the bits of the multi-stream on which the XOR operation is performed in response to the value of $n/j$ not being an integer.

The zero interpolator may be further configured to periodically insert N (=L−1) zero values between the bits of the multi-stream on which the XOR operation is performed.

In another general aspect, a high-order syndrome calculator includes a serial-to-parallel converter configured to convert serial bit sequences received from a transmitter to a parallel multi-stream configured based on a symbol unit, wherein the symbol unit may include a plurality of bits; an exclusive OR (XOR) operator configured to perform an XOR operation on bit values of the multi-stream based on the symbol unit; a zero interpolator configured to insert zero values between the bits of the multi-stream on which the XOR operation is performed; and a linear feedback shift register configured to calculate a high-order syndrome value based on a coefficient of a remainder obtained by dividing, by a primitive polynomial, a polynomial generated from the multi-stream in which the zero values are inserted.

The serial-to-parallel converter may be further configured to convert the received serial bit sequences to a (symbol unit×L)-bit multi-stream, L denoting a natural number satisfying $L \geq 1$, by delaying the received serial bit sequences by integer multiples of a predetermined number of bits satisfying the equation $D=n/j$, where D denotes the predetermined number of bits, n denotes a block size of a block code, j denotes a syndrome order to be calculated, and $n/j$ denotes an integer.

The serial-to-parallel converter may be further configured to output the received serial bit sequences to the zero interpolator without delaying the received serial bit sequences in response to a value of $n/j$ not being an integer.

The zero interpolator may be further configured to periodically insert N (=j−1) zero values of the symbol unit between the bits of the multi-stream on which the XOR operation is performed in response to the value of $n/j$ not being an integer.

The zero interpolator may be further configured to periodically insert N (=L−1) zero values of the symbol unit between the bits of the multi-stream on which the XOR operation is performed.

In another general aspect, a method of calculating a high-order syndrome includes converting serial bit sequences received from a transmitter to a parallel multi-stream; performing an exclusive OR (XOR) operation on bit values of the multi-stream; inserting zero values between the bits on which the XOR operation is performed; and calculating a high-order syndrome value based on a coefficient of a remainder obtained by dividing, by a primitive polynomial, a polynomial generated from the multi-stream in which the zero values are inserted.

In another general aspect, a non-transitory computer-readable storage medium stores a program including instructions to control a computer to perform the method described above.

In another general aspect, a method of calculating a high-order syndrome includes converting serial bit sequences received from a transmitter to a parallel multi-stream configured based on a symbol unit, wherein the symbol unit may include a plurality of bits; performing an exclusive OR (XOR) operation on bit values of the multi-stream based on the symbol unit; inserting zero values between the bits of the multi-stream on which the XOR operation is performed; and calculating a high-order syndrome value based on a coefficient of a remainder obtained by dividing, by a primitive polynomial, a polynomial generated from the multi-stream in which the zero values are inserted.

In another general aspect, a non-transitory computer-readable storage medium stores a program including instructions to control a computer to perform the method described above.

Other features and aspects will be apparent from the following detailed description, the drawings, and the claims.

BRIEF DESCRIPTION OF THE DRAWINGS

FIG. 11 illustrates an example of a table showing a result of comparing a calculation complexity using a conventional syndrome calculation method and a calculation complexity using a high-order syndrome calculation method disclosed in this application.

FIG. 12 illustrates an example of a table showing a result of comparing a calculation complexity using a conventional syndrome calculation method and a calculation complexity using a high-order syndrome calculation method disclosed in this application to calculate $S_3$ when m=6 and n=$2^m$−1=63.

DETAILED DESCRIPTION

Figure 1:
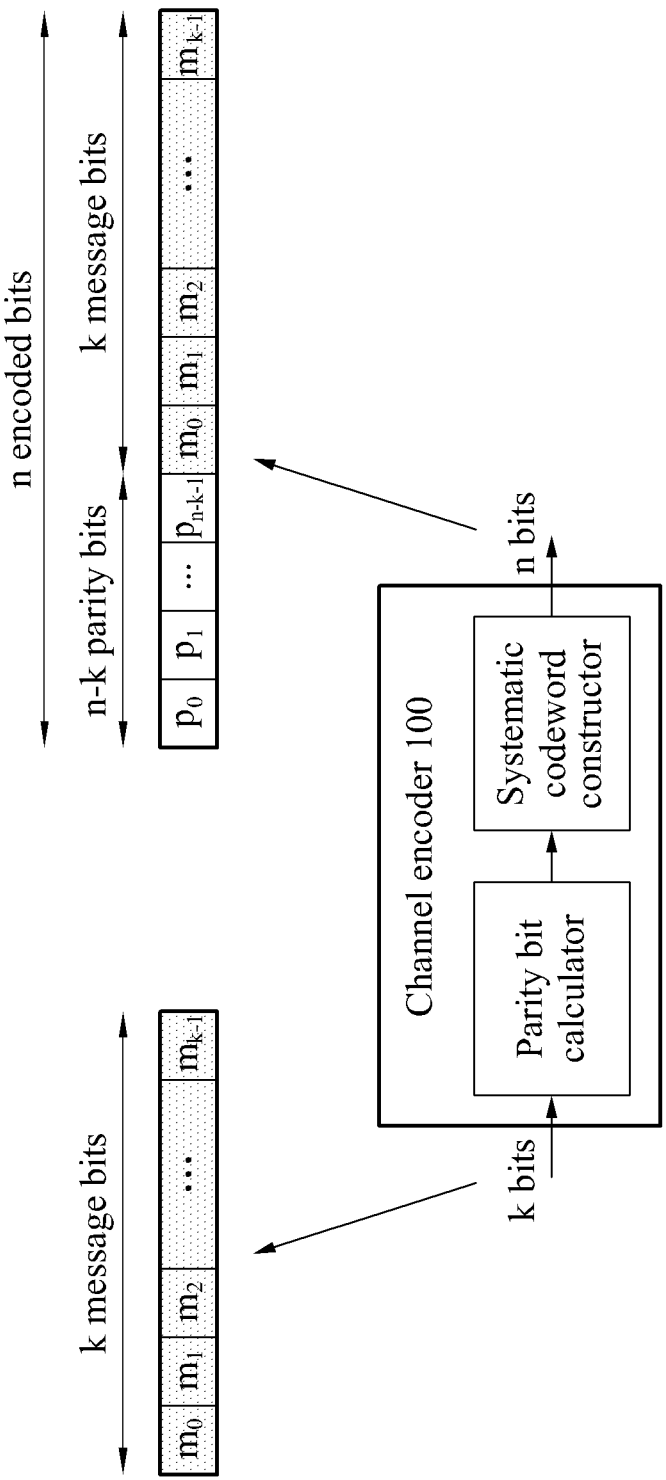
FIG. 1 illustrates an example of a channel encoder configured to encode a block code in a transmitter.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

An error correcting code is a technology capable of improving communication reliability in a digital communication system. For example, due to various non-ideal communication channel environments, for example, random noise, an error may occur in bit information received by a receiver. In this example, the receiver may detect and correct an error using an error correcting code and a transmitter may recover bit information that is to be transmitted, thereby enhancing the communication reliability.

An error correcting code may be divided into a block code and a convolutional code. The block code is a basic code that is widely used and is encoded based on a block unit of a predetermined length. The block code configures an encoded bit sequence of a predetermined length by adding a redundant bit called a parity bit to message bit information of a predetermined length that is to be transmitted.

A Hamming code, a most basic block code, is a block code having an error correcting capability of one bit. In detail, the Hamming code can correct an error when a single bit error occurs in a bit sequence of a single block received from the transmitter, but cannot correct an error properly when an error occurs in two or more bits.

A Bose-Chaudhuri-Hocquenghem (BCH) code can correct errors in two or more bits using a variety of parameters. The Hamming code may be regarded as a single type of the BCH code.

A Reed-Solomon (RS) code treats a plurality of bits as a single symbol and performs signal processing based on a symbol unit. The RS code may treat a plurality of bits as a single symbol and configure a predetermined number of symbols as a single block.

The RS code may perform encoding and decoding based on a symbol unit and may perform error correction based on a predetermined number of symbol units. When a plurality of bits is present in a single symbol, the RS code may correct an error based on a symbol unit. Therefore, the RS code may be robust against a burst error in which errors occur in adjacent bits.

FIG. 1 illustrates an example of a channel encoder 100 configured to encode a block code in a transmitter.

The channel encoder 100 configures a total of n sequence blocks by appropriately adding (n−k) parity bits corresponding to redundant bits to k message bits corresponding to original bit information, and transmits the n sequence blocks to a receiver.

The n bit sequence blocks transmitted by the channel encoder 100 using the above method are referred to as a (n, k) block code, and an n-bit sequence that is output from the channel encoder 100 is referred to as a codeword. In this example, k message bits in the n-bit sequence are transmitted without being modified and by adding (n–k) parity bits, and thus the n-bit sequence is referred to as a systematic code. The receiver receives and decodes a bit sequence encoded by the channel encoder 100. A channel decoder of the receiver is described with reference to FIG. 2.

Figure 2:
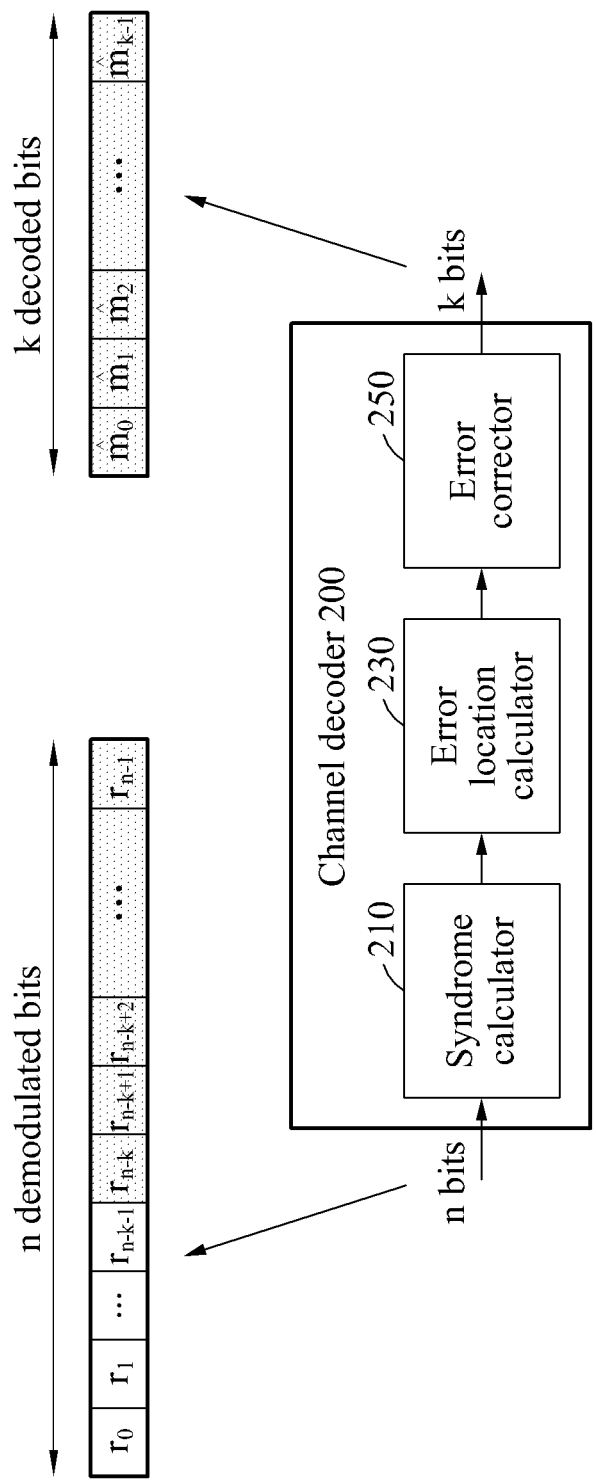
FIG. 2 illustrates an example of a channel decoder configured to decode a block code in a receiver.

FIG. 2 illustrates an example of a channel decoder 200 configured to decode a block code in a receiver.

In the receiver, a bit sequence demodulated to "0" or "1" through a demodulator is input to the channel decoder 200. Due to some non-ideal communication channel environments, for example, noise, an error bit may be present in the demodulated bit sequence.

Referring to FIG. 2, the channel decoder 200 corrects an error by appropriately performing signal processing on n demodulated bit sequences and acquires k decoded output bit sequences. When an error occurs in bits of a demodulated bit sequence beyond the error correcting capability of a block code, an output bit sequence will differ from an original bit sequence transmitted from a transmitter.

The channel decoder 200 includes a syndrome calculator 210, an error location calculator 230, and an error corrector 250.

The syndrome calculator 210 calculates a syndrome value.

The term "syndrome value" refers to a value used as a determination standard capable of verifying whether an error is present in a bit sequence transmitted from the transmitter to the receiver. For example, a syndrome value is not zero indicates the occurrence of an error, and thus the receiver may perform signal processing to correct the error.

To correct an error, a location of a bit in which the error has occurred in the entire bit sequence needs to be known. When the location is known, the bit may be corrected. The error location calculator 230 calculates the location of the bit in which the error has occurred. A syndrome value may be used to calculate the location of the bit in which the error has occurred.

The error corrector 250 corrects the error of the bit at the location of the bit calculated by the error location calculator 230. For example, the error corrector 250 may correct a bit in which an error has occurred from "1" to "0", or may correct the bit from "0" to "1".

When using a Hamming code having the error correcting capability for a single bit, only a single syndrome value needs to be calculated. When using a code having the error correcting capability for a plurality of bits, a plurality of syndrome values needs to be calculated, thereby increasing a calculation complexity.

When calculating a plurality of syndrome values, it is assumed that syndrome order=j and $j^{th}$ syndrome=$S_j$. A detailed definition of $S_j$ and a mathematical description related thereto will be provided below. According to an increase in j denoting a syndrome order, for example, according to an increase in a high-order syndrome value, the calculation complexity may further increase.

In one example, a method of decreasing the calculation complexity of a high-order syndrome of which "j" is greater than "1" in a block code having the error correcting capability for a plurality of bits will be described.

Prior to describing a syndrome calculation method, a Galois field that is a basis of a block code and an operation of the Galois field will be described.

The Galois field may be represented as $GF(p^m)$ by a prime number p and a positive integer m, and may also be referred to as a finite field since the Galois field has a finite number of elements.

$p^m$ elements are present in $GF(p^m)$. A primitive element and a primitive polynomial used in the Galois field may be defined as follows.

In the case of the primitive element, if a primitive $(q-1)^{th}$ root of unity is satisfied in GF(q), $\alpha \in GF(q)$ is referred as a primitive element of the finite field GF(q). All the constituent elements, excluding "0", of the finite field GF(q) may represent a positive integer n as $\alpha^n$.

In the case of the primitive polynomial, if a polynomial f(x) having a coefficient in GF(p) has a degree of m and has root a satisfying $\{0, 1, \alpha, \alpha^2, \ldots, \alpha\hat{}(p^m-2)\}$ in $GF(p^m)$, the polynomial is referred to as a primitive polynomial. If $f(x)/(x^n+1)$ is a minimum positive integer n satisfying $n=2^m-1$, a degree m of a irreducible polynomial f(x) is referred to as a primitive.

If a primitive element of a Galois field $GF(p^m)=a$ and an m-degree primitive $$\text{polynomial} = f(x) = \sum_{i=0}^{m} f_i x^i$$

based on the definitions made above, equations of $\alpha^{2^m-1}=1$ and $f(\alpha)=0$ are established, which is already known.

For example, if m=6, $\alpha^{63}=1$ and $f(\alpha)=1+\alpha+\alpha^6=0$. Galois field operations include a modulo addition operation such as $1+1=0$ and $\alpha^i+\alpha^i=0$. Using the same, $\alpha^6=1+\alpha$ may be obtained.

Also, the Galois field operations include a multiplication such as $\alpha^i \cdot \alpha^j = \alpha^{i+j}$. Using the same, $\alpha^7=\alpha \cdot \alpha^6=\alpha(1+\alpha)=\alpha+\alpha^2$ may be obtained. Using a similar Galois field operation process, elements of $GF(p^m)$ for m=6 may be constructed as expressed by Table 1 below.

The following Table 1 shows $GF(2^6)$ constituent elements generated based on the primitive polynomial "$1+x+x^6$".

TABLE 1

| Power representation | Polynomial representation | Vector representation |
|---|---|---|
| 0 | 0 | [0 0 0 0 0 0] |
| 1 | 1 | [1 0 0 0 0 0] |
| $\alpha$ | $0 + \alpha$ | [0 1 0 0 0 0] |
| $\alpha^2$ | $0 + 0 + \alpha^2$ | [0 0 1 0 0 0] |
| $\alpha^3$ | $0 + 0 + 0 + \alpha^3$ | [0 0 0 1 0 0] |
| $\alpha^4$ | $0 + 0 + 0 + 0 + \alpha^4$ | [0 0 0 0 1 0] |
| $\alpha^5$ | $0 + 0 + 0 + 0 + 0 + \alpha^5$ | [0 0 0 0 0 1] |
| $\alpha^6$ | $1 + \alpha$ | [1 1 0 0 0 0] |
| $\alpha^7$ | $0 + \alpha + \alpha^2$ | [0 1 1 0 0 0] |
| ... | ... | ... |
| $\alpha^{61}$ | $1 + 0 + 0 + 0 + \alpha^4 + \alpha^5$ | [1 0 0 0 1 1] |
| $\alpha^{62}$ | $1 + 0 + 0 + 0 + 0 + \alpha^5$ | [1 0 0 0 0 1] |

In Table 1, the first column is a power representation that represents a multiplier of a primitive element $\alpha$, and the second column is a polynomial representation that represents the same element of the first column as $$\sum_{l=0}^{m-1} c_l \alpha^l \cdot c_l$$

denotes a coefficient having a value of "0" or "1".

The third column is a vector representation that represents values of $C_l$ in a vector form such as $[C_0\ C_1\ C_2\ C_3\ C_4\ C_5]$. When configuring a lookup table (LUT) that uses an integer corresponding to the multiplier of a as an input index and uses a vector value as an output, the LUT is represented as illustrated in FIG. 3.

Figure 3:
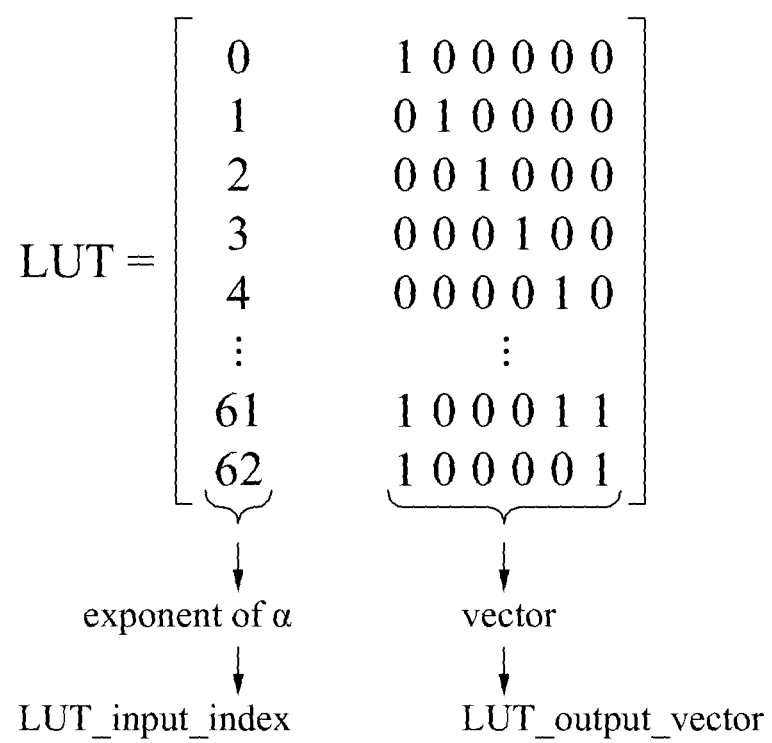
FIG. 3 illustrates an example of a lookup table (LUT) used for an operation of a primitive polynomial in a Galois field using a conventional syndrome calculation method.

FIG. 3 illustrates an example of a LUT used for an operation of a primitive polynomial in a Galois field using a conventional syndrome calculation method.

Hereinafter, a basic equation of calculating a syndrome will be described.

When representing, as $[r_0\ r_1\ r_2\ \ldots\ r_{n-1}]$, a bit vector that is received by a receiver and includes n bits in which an error is included, a polynomial thereof may be represented as $r(x)=r_0+r_1x+r_2x^2+\ldots+r_{n-1}x^{n-1}$. $S_1$ corresponding to a $j^{th}$ syndrome may be calculated according to the following Equation 1.

$$S_j = r(\alpha^j) \qquad \text{[Equation 1]}$$

where $r(x)=r_0+r_1x+r_2x^2+\ldots+r_{n-1}x^{n-1}$ is the received polynomial

In Equation 1, $\alpha$ denotes the primitive element of $GF(p^m)$ and $n=2^m-1$.

As described above, a process of calculating a syndrome corresponds to a signal processing process that is initially performed when decoding a block code. A syndrome value that is not "0" indicates that an error correction is required due to the occurrence of an error in received bits.

Hereinafter, the conventional syndrome calculation method to calculate $S_3$ will be described.

Using Equation 1, $S_3$ may be expressed as follows:

$$S_3 = r(\alpha^3) =$$
$$r_0 + r_1\alpha^3 + r_2(\alpha^3)^2 + \ldots + r_{n-1}(\alpha^3)^{n-1} = \sum_{i=0}^{n-1} r_i\alpha^{3i} = \sum_{l=1}^{m} bxor(l)\alpha^{l-1}$$

bxor(l) denotes an $l^{th}$ value of bxor that is a vector including m bits, and bxor may be obtained as follows:

$$bxor = \sum_{i=0}^{n-1} r_i f_{LUT}(\text{mod}(3i,n)) =$$
$$r_0 f_{LUT}(0) \oplus r_1 f_{LUT}(3) \oplus \ldots \oplus r_{n-1} f_{LUT}(\text{mod}(3(n-1),n))$$

$f_{LUT}(\bullet)$ denotes a LUT function of FIG. 3 and the relationship of LUT_output_vector=$f_{LUT}$(LUT_input_index) is satisfied.

To further easily describe the above signal processing, when m=6, n=$2^m$−1=63, and r(x)=1+$x^2$+ . . . +$x^{22}$+ . . . +$x^{62}$, $S_3$=r($\alpha^3$)=1+$\alpha^{3\times2}$+ . . . +$\alpha^{3\times22}$+ . . . +$\alpha^{3\times62}$ is obtained.

Accordingly, a process of calculating a syndrome of $S_3$ corresponds to a process of calculating $\alpha^i$ of a gradually increasing multiplier and adding up the calculation results. A process of calculating a syndrome of $S_3$ using the conventional syndrome calculation method may be expressed as illustrated in FIG. 4.

Figure 4:
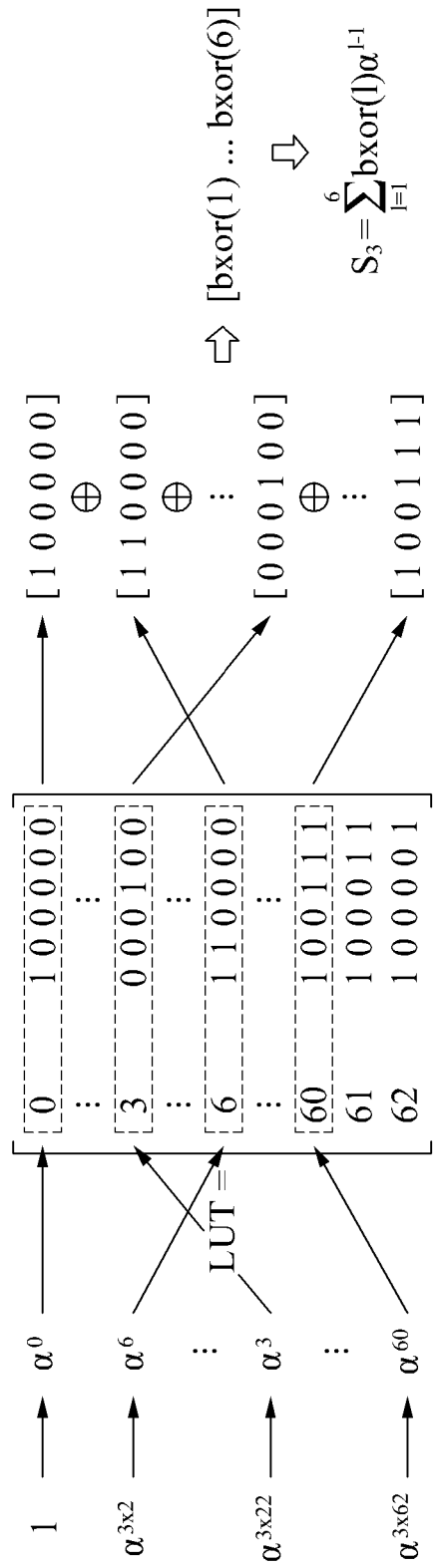
FIG. 4 illustrates an example of a process of calculating $S_3$ when M=6 and n=63 using the conventional syndrome calculation method.

FIG. 4 illustrates an example of a process of calculating $S_3$ when M=6 and n=63 using the conventional syndrome calculation method.

Referring to FIG. 4, when calculating a multiplier value of a of the first column, the conventional syndrome calculation method performs a process of multiplying an index of a bit sequence by a value corresponding to a syndrome order.

In the second column, the conventional syndrome calculation method performs a modulo-($2^m$−1), that is, modulo-63 operation on the calculated multiplier. As described above, in the Galois field, the property of $\alpha^{2^m-1}=1$ is satisfied and the same value is obtained even though modulo-($2^m$−1) is applied to the multiplier value of $\alpha$. Accordingly, the conventional syndrome calculation method performs the modulo-63 operation.

The conventional syndrome calculation method performs a process of obtaining an output vector of a LUT (LUT_output_vector) when the multiplier value of $\alpha$ obtained after performing the modulo-63 operation is used as an input value, and outputting the obtained output value.

The conventional syndrome calculation method performs a bitwise exclusive OR (XOR) operation on each of output vectors and obtains syndrome $S_3=\Sigma_{l=1}^{m}=bxor(l)\alpha^{l-1}$ by using bxor(l) corresponding to a final value as a coefficient.

However, as described above, the conventional syndrome calculation method uses a multiplication and a modulo operation. The conventional syndrome calculation method uses a storage space to store a large size of bit information to construct a LUT.

In addition, the conventional syndrome calculation method needs to perform a continuous search process of finding, using an input index, storage information that maps the input index. Accordingly, a LUT function call is frequently performed. The frequent LUT function increases an operation complexity and an amount of power consumption.

Figure 5:
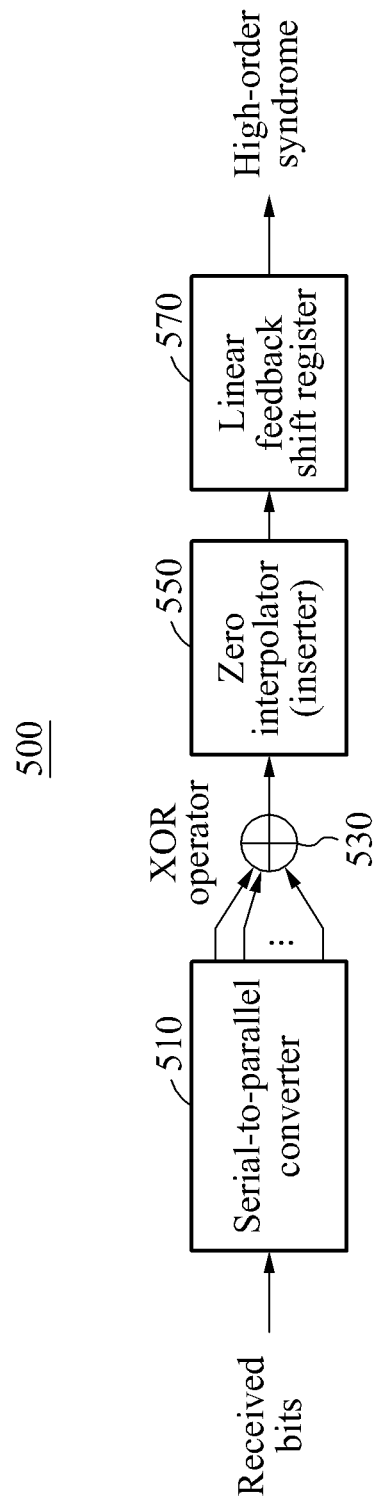
FIG. 5 illustrates an example of a high-order syndrome calculator.

FIG. 5 illustrates an example of a high-order syndrome calculator 500.

Referring to FIG. 5, the high-order syndrome calculator 500 includes a serial-to-parallel converter 510, an XOR operator 530, a zero interpolator (inserter) 550, and a linear feedback shift register 570.

The serial-to-parallel converter 510 converts serial bit sequences received from a transmitter to a parallel multi-stream.

The serial-to-parallel converter 510 converts the received serial bit sequences to an L-bit multi-stream by delaying the received serial bit sequences by integer multiples of a predetermined number of bits satisfying "D=n/j". L denotes a natural number satisfying L≥1, D denotes the predetermined number of bits, n denotes a block size of a block code, j denotes a syndrome order to be calculated, and n/j denotes an integer.

The XOR operator 530 performs an XOR operation on bit values of the converted multi-stream. For example, when a first multi-stream is [$a_0\ a_1\ a_2\ a_3\ a_4\ a_5$] and a second multi-stream is [$b_0\ b_1\ b_2\ b_3\ b_4\ b_5$], the XOR operator 530 performs an XOR operation on bit values as expressed by [$a_0 \oplus b_0$ $a_1 \oplus b_1$ $a_2 \oplus b_2$ $a_3 \oplus b_3$ $a_4 \oplus b_4$ $a_5 \oplus b_5$]. In this example, $\oplus$ denotes an XOR operation, for example, a modulo-2 operation.

The zero interpolator (inserter) 550, hereinafter referred to as the zero interpolator 550, inserts zero values between the bits on which the XOR operation is performed. The zero interpolator 550 periodically inserts N (=L−1) zero values between the bits of the multi-stream on which the XOR operation is performed.

When the predetermined number of bits D calculated by the serial-to-parallel converter 510, that is, the value of n/j, is not an integer, the zero interpolator 550 periodically inserts N (=j−1) zero values between the bits of the multi-stream on which the XOR operation is performed.

The linear feedback shift register 570 calculates a high-order syndrome value based on a coefficient of a remainder obtained by dividing, by a primitive polynomial, a polynomial generated from the multi-stream in which the zero values are inserted.

Figure 6:
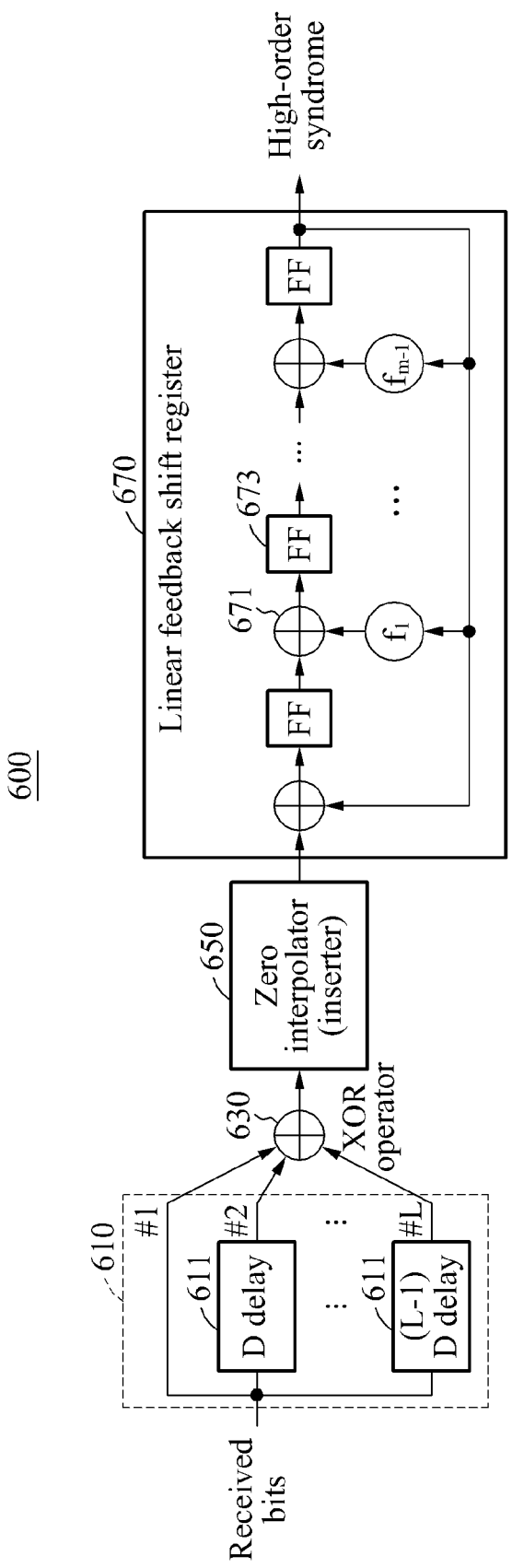
FIG. 6 illustrates a detailed example of a high-order syndrome calculator.

FIG. 6 illustrates a detailed example of a high-order syndrome calculator 600.

Referring to FIG. 6, the high-order syndrome calculator 600 includes a serial-to-parallel converter 610, an XOR operator 630, a zero interpolator (inserter) 650, and a linear feedback shift register 670.

Serial bit sequences received from a transmitter pass through the serial-to-parallel converter 610. The serial-to-parallel converter 610 includes (L−1) delay elements 611. A delay element may be a register corresponding to a flip-flop or a unit-delay element.

The serial-to-parallel converter 610 outputs an input bit sequence as a first bit of a multi-stream without delaying the bit sequence, and outputs a bit sequence as an $L^{th}$ bit of the multi-stream after delaying the bit sequence by (L−1)×D bits.

In an example in which the serial-to-parallel converter 610 converts serial bit sequences to an L-bit multi-stream, the serial-to-parallel converter 610 includes L parallel paths, delays the received serial bit sequences by an amount of time corresponding to integer multiples of the predetermined number of bits with respect to L parallel paths, and inputs the delayed serial bit sequences.

In a first path, a received bit sequence is output without being delayed. In a second path, the bit sequence is delayed by D bits compared to the first path and output. In a third path, the bit sequence is delayed by 2D bits compared to the first path and output. In the same manner, in an $L^{th}$ path, the bit sequence is delayed by (L−1)×D bits compared to the first path and output.

The XOR operator 630 performs an XOR operation on bit values of the multi-stream.

The zero interpolator (inserter) 650, hereinafter referred to as the zero interpolator 650, periodically inserts N (=L−1) zero values between the bits of the multi-stream on which the XOR operation is performed. Hereinafter, a method of setting L, D, and N will be described.

When a block size of a block code is n and a syndrome order to be calculated is j, that is, when $S_j$ is to be calculated, the high-order syndrome calculator 600 may use values L=j, D=n/j, and N=L−1.

When a value of n/j is not an integer, the high-order syndrome calculator 600 may set values of L, D, and N to be L=1, D=0, and N=j−1. In this example, the high-order syndrome calculator 600 performs a zero interpolation on a received bit sequence as is using the zero interpolator 650 without performing a conversion process using the serial-to-parallel converter 610.

The multi-stream in which zero values are inserted is used as an input of the linear feedback shift register 670.

Each of flip-flops (FF) 673 may be replaced with a register corresponding to a unit-delay element.

The linear feedback shift register 670 includes a number of FFs 673 equal to "m" satisfying "$n=2^m-1$". In the linear feedback shift register 670, $f_l$ may have a value of "0" or "1".

In the linear feedback shift register 670, if $f_l$ has a value of "0", a line connected to an XOR operator 671 is not present. If $f_l$ has a value of "1", a line connected to the XOR operator 671 is present.

$f_l$ denotes a coefficient of a primitive polynomial $f(x)$ having a degree of m, and $$f(x) = \sum_{l=0}^{m} f_l x^l$$

is satisfied.

When an $l^{th}$ FF value stored last after all the input values of the linear feedback shift register 670 are input is lfsr(l), a high-order syndrome value may be calculated using $$\sum_{l=1}^{m} lfsr(l)\alpha^{l-1}$$

that includes coefficients of lfsr(l).

The linear feedback shift register 670 is configured to output a result corresponding to a remainder obtained by dividing an input polynomial by a primitive polynomial $f(x)$.

A value stored in each FF 673 at a point in time in which the linear feedback shift register 670 receives all the input sequences corresponds to a coefficient of a remainder polynomial obtained when dividing the input polynomial by $f(x)$.

To further describe an operation of the high-order syndrome calculator 600, an example of calculating a syndrome of $S_3$ will be described.

For example, when m=6 and $n=2^m-1=63$, the entire operation of calculating $S_3$ may be expressed by the following Equation 2.

$$\begin{aligned} S_3 &= r(\alpha^3) = r_0 + r_1\alpha^3 + r_2(\alpha^3)^2 + \ldots + r_{n-1}(\alpha^3)^{n-1} \quad \text{[Equation 2]} \\ &= r_0 + r_1\alpha^3 + r_2\alpha^6 + \ldots + r_{21}\alpha^{mod(3\times 21,63)} + \\ &\quad r_{22}\alpha^{mod(3\times 22,63)} + r_{23}\alpha^{mod(3\times 23,63)} + \ldots + \\ &\quad r_{n-1}\alpha^{mod(3(n-1),63)} \\ &= (r_0 \oplus r_{21} \oplus r_{42}) + (r_1 \oplus r_{22} \oplus r_{43})\alpha^3 + \\ &\quad (r_2 \oplus r_{23} \oplus r_{44})\alpha^6 + \ldots + (r_{20} \oplus r_{41} \oplus r_{62})\alpha^{60} \\ &= Q(\alpha)f(\alpha) + R(\alpha) = Q(\alpha)(1 + \alpha + \alpha^6) + R(\alpha) \\ &= R(\alpha) \end{aligned}$$

In Equation 2, $r(x)=r_0+r_1 x+r_2 x^2+\ldots+r_{n-1}x^{n-1}$ denotes a received polynomial, and Q(x) and R(x) respectively denote a quotient and a remainder obtained when dividing, by $f(x)$, a primitive polynomial that is the received polynomial.

In the Galois field, $f(\alpha)=0$ is satisfied with respect to the primitive element α, and, thus the final result of Equation 2 is obtained.

Figure 7:
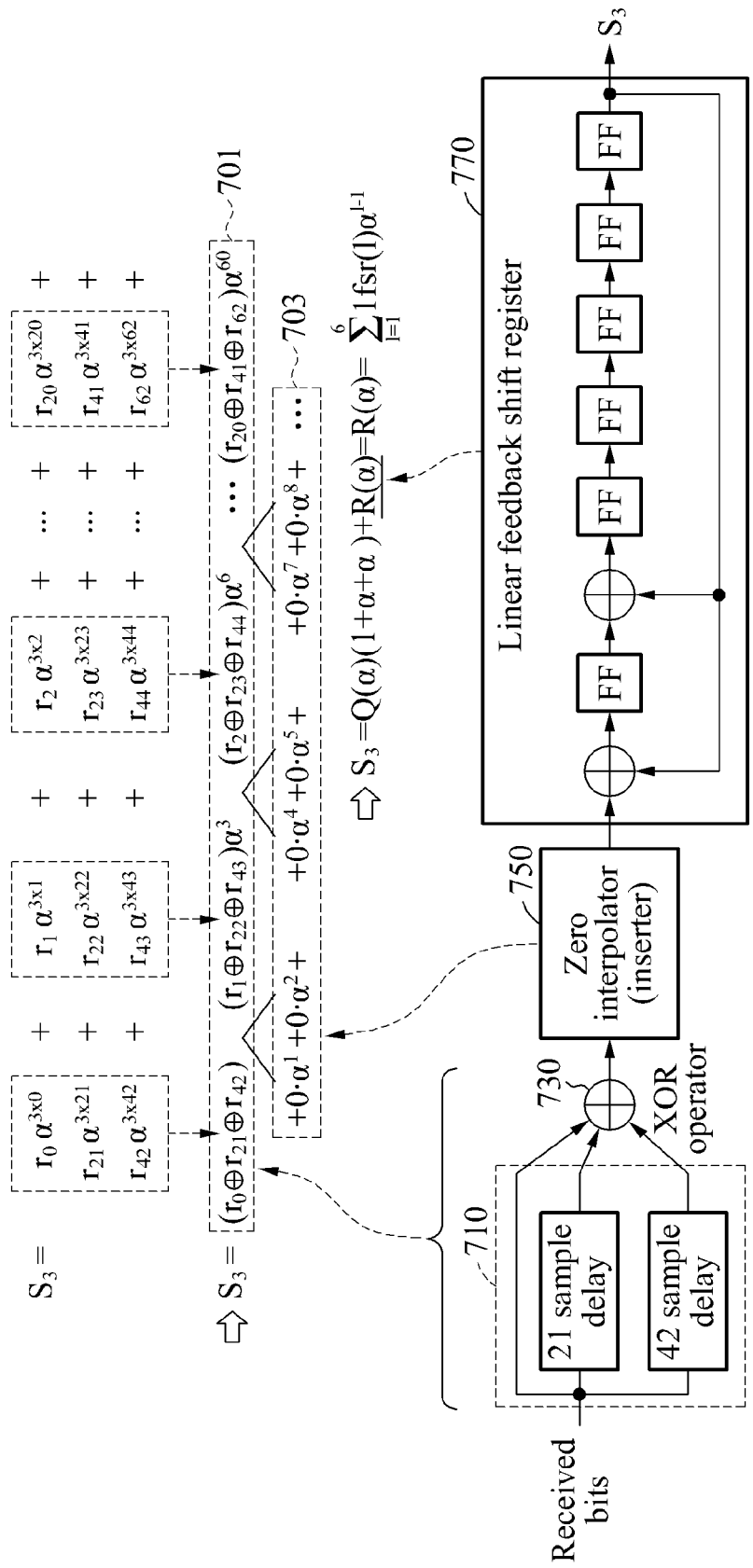
FIG. 7 illustrates an example of a process performed at each portion of a high-order syndrome calculator to calculate $S_3$ when m=6 and n=63.

For easy description, a method of calculating $S_3=r(\alpha^3)=r_0+r_1\alpha^{3\times 1}+r_2\alpha^{3\times 2}+\ldots+r_{62}\alpha^{3\times 62}$ when "n=63" may be intuitively represented with a high-order syndrome calculator illustrated in FIG. 7.

FIG. 7 illustrates an example of a process performed at each portion of a high-order syndrome calculator to calculate $S_3$ when m=6 and n=63.

Referring to FIG. 7, it can be seen that three values are grouped together and thereby represented as a single term, for example, $r_1\alpha^3+r_{22}\alpha^{3\times22}+r_{43}\alpha^{3\times43}=(r_1\oplus r_{22}\oplus r_{43})\alpha^3$. Such representation is possible since the property of $\alpha^{2^m-1}=1$ is satisfied, and if m=6, $\alpha^{3\times22}=\alpha^{63+3}=\alpha^3$ is satisfied and $\alpha^{3\times43}=\alpha^{2\times63+3}=\alpha^3$ is satisfied in the Galois field.

In the Galois field, a second equation 701 of $S_3$ is obtained by grouping three values into a single term from a first equation of $S_3$ using the property of $\alpha^{2^m-1}=m$.

A process of delaying input serial bit sequences as expressed by the first equation of $S_3$ by integer multiples of a predetermined number of bits and outputting the delayed bit sequences on parallel paths is performed by a serial-to-parallel converter 710.

An XOR operation on bit values of the multi-stream in the second equation 701 of $S_3$ is performed by the XOR operator 730.

In an example in which a temporally most initially received bit is $r_{62}$ and a temporally last received bit is $r_0$, the serial-to-parallel converter 710 processes the bits so that a bit stream is received sequentially in order of $r_{62}$, $r_{61}$, $r_{60}$, ..., $r_{44}$, $r_{43}$, $r_{42}$ in a first path, a bit stream delayed by 21 samples compared to the first path, i.e., $r_{41}$, $r_{40}$, $r_{39}$, ..., $r_{23}$ $r_{22}$, $r_{21}$, is received in a second path, and a bit stream delayed by 42 (=21×2) samples compared to the first path, i.e., $r_{20}$, $r_{19}$, $r_{18}$, ..., $r_2$, $r_1$, $r_0$, is received in a third path.

The XOR operator 730 performs an XOR operation on bit values of streams input in parallel every time new bits are input and outputs a result of the XOR operation.

In the result obtained by the XOR operator 730, a multiplier value of $\alpha^i$ increases by "3", and thus a zero interpolator 750 inserts terms of $\alpha^i$ between the values of the second equation 701 as expressed by an equation 703. In this example, coefficients of the inserted terms $\alpha^i$ are set to "0". The zero interpolator 750 inserts terms each having a coefficient of zero due to the following reasons.

As already known, signal processing of calculating a polynomial c(x) corresponding to a remainder obtained when dividing a predetermined polynomial a(x) by another polynomial b(x) in the Galois field may be easily performed by a linear feedback shift register 770.

In this example, a sequence, for example, a multi-stream applied as an input of the linear feedback shift register 770, is a sequence that includes coefficients of $x^i$ of the polynomial a(x).

When a sequence corresponding to a coefficient of $x^i$ is input without omission of any coefficients according to a variation in i corresponding to a multiplier, the linear feedback shift register 770 may calculate a remainder polynomial $R(\alpha)$ based on a value finally stored in an FF. In this example, the zero interpolator 750 inserts $\alpha^i$ terms having zeros as coefficients as expressed by the second equation 703 to input the sequence corresponding to the coefficient of $x^i$ without omission of any coefficients.

When a polynomial generated from the multi-stream in which zero values are inserted is applied as an input, the linear feedback shift register 770 calculates $S_3$ based on values finally stored in FFs.

As described above, the linear feedback shift register 770 obtains information of a polynomial, for example, a coefficient of a polynomial corresponding to a remainder obtained when dividing, by a primitive polynomial, an input polynomial in which zero values are inserted.

A value applied as the input of the linear feedback shift register 770 is a bit sequence corresponding to a coefficient of term $\alpha_t$ in a polynomial form. When all the bit sequences are input and when an $l^{th}$ FF value stored in the linear feedback shift register 770 is lfsr(l), $$S_3 = \sum_{l=1}^{6} lfsr(l)\alpha^{l-1}$$

is obtained.

When m=6, the primitive polynomial is $f(x)=1+X+x^6$ and $f_1=1$, $f_2=f_3=f_4=f_5=0$. Accordingly, in the linear feedback shift register 770, a line corresponding to $f_1=1$ is connected, and lines corresponding to $f_2$, $f_3$, $f_4$, $f_5$ are not connected.

Although an operation of a high-order syndrome calculator in the case of using a binary block code has been described above, the high-order syndrome calculator may be applied substantially similarly to a non-binary code, for example, an RS code. In the non-binary code, signal processing is performed based on a symbol unit including a plurality of bits, for example, m bits, instead of based on a single bit unit.

For example, a signal may be input to the serial-to-parallel converter 710 and the zero interpolator 750 may insert N zero symbols. In this example, a single zero symbol may include m zero bits. Symbols including m bits may be stored in FFs included in the linear feedback shift register 770.

An example of a high-order syndrome calculator configured to calculate a syndrome value for bit sequences configured based on a symbol unit will be described with reference to FIG. 8.

Figure 8:
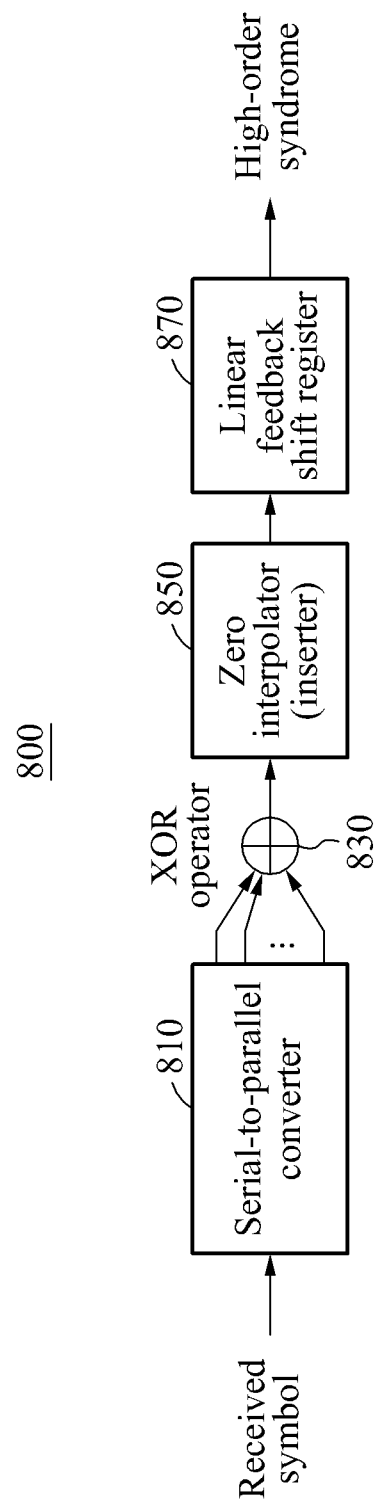
FIG. 8 illustrates another example of a high-order syndrome calculator.

FIG. 8 illustrates another example of a high-order syndrome calculator 800.

The high-order syndrome calculator 800 is configured to calculate a syndrome value for bit sequences configured based on a symbol unit.

Referring to FIG. 8, the high-order syndrome calculator 800 includes a serial-to-parallel converter 810, an XOR operator 830, a zero interpolator 850, and a linear feedback shift register 870.

The serial-to-parallel converter 810 converts serial bit sequences received from a transmitter to a parallel multi-stream configured based on a symbol unit. The symbol unit includes a plurality of bits.

The serial-to-parallel converter 810 converts the received serial bit sequences to a (symbol unit×L)-bit multi-stream by delaying the received serial bit sequences by integer multiples of a predetermined number of bits satisfying "D=n/j". "Symbol unit" denotes a number of bits in one symbol unit, L denotes a natural number satisfying L≥1, D denotes the predetermined number of bits, n denotes a block size of a block code, j denotes a syndrome order to be calculated, and n/j denotes an integer. Thus, "(symbol unit×L)-bit" denotes a number of bits in L symbol units.

When a value of n/j is not an integer, the serial-to-parallel converter 810 outputs the received serial bit sequences to the zero interpolator 850 without delaying the received serial bit sequences.

The XOR operator 830 performs an XOR operation on bit values of the parallel multi-stream based on the symbol unit.

The zero interpolator 850 inserts zero values between the bits of the multi-stream on which the XOR operation is performed. The zero interpolator 850 periodically inserts N (=L−1) zero values of the symbol unit between the bits of the multi-stream on which the XOR operation is performed.

When the value of n/j is not an integer, the zero interpolator 850 periodically inserts N (=j−1) zero values between the bits of the multi-stream on which the XOR operation is performed.

The linear feedback shift register 870 calculates a high-order syndrome value based on a coefficient of a remainder obtained by dividing, by a primitive polynomial, a polynomial generated from the multi-stream in which the zero values are inserted.

Figure 9:
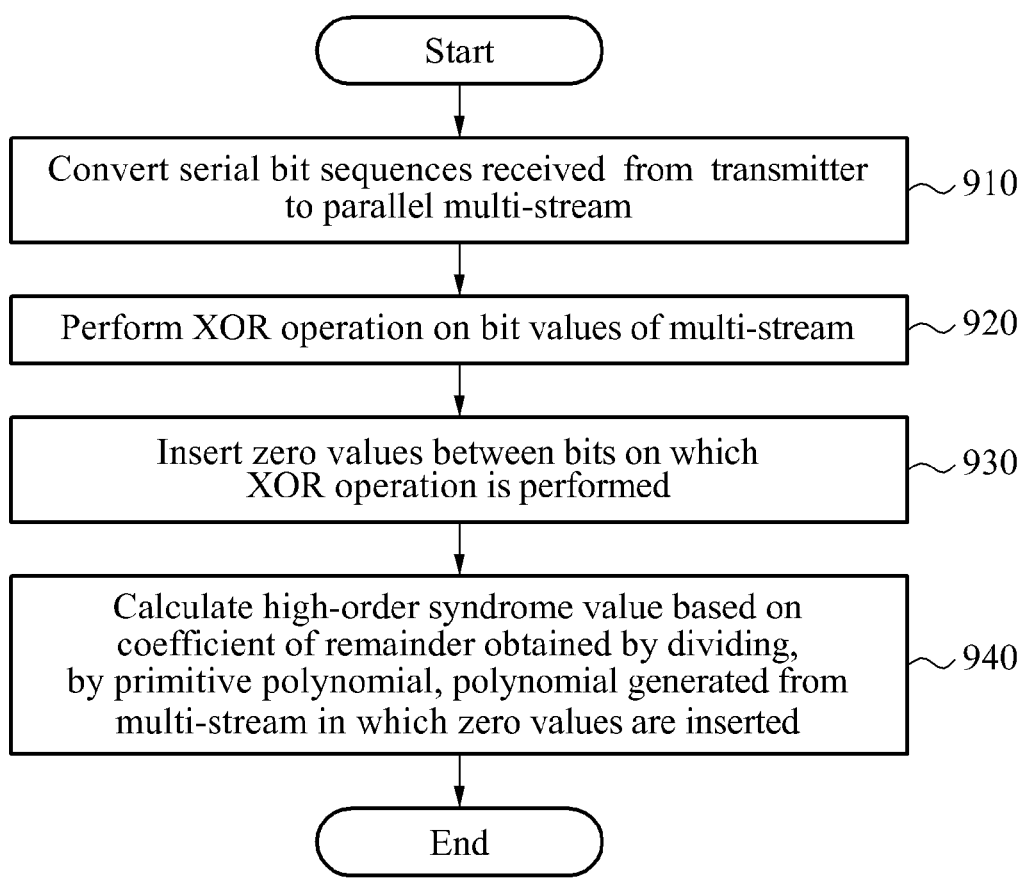
FIG. 9 illustrates an example of a method of calculating a high-order syndrome.

FIG. 9 illustrates an example of a method of calculating a high-order syndrome.

Referring to FIG. 9, in operation 910, a high-order syndrome calculator (hereinafter, a calculator) converts serial bit sequences received from a transmitter to a parallel multi-stream.

In operation 920, the calculator performs an XOR operation on bit values of the multi-stream.

In operation 930, the calculator inserts zero values between the bits on which the XOR operation is performed.

In operation 940, the calculator calculates a high-order syndrome value based on a coefficient of a remainder obtained by dividing, by a primitive polynomial, a polynomial generated from the multi-stream in which the zero values are inserted.

Figure 10:
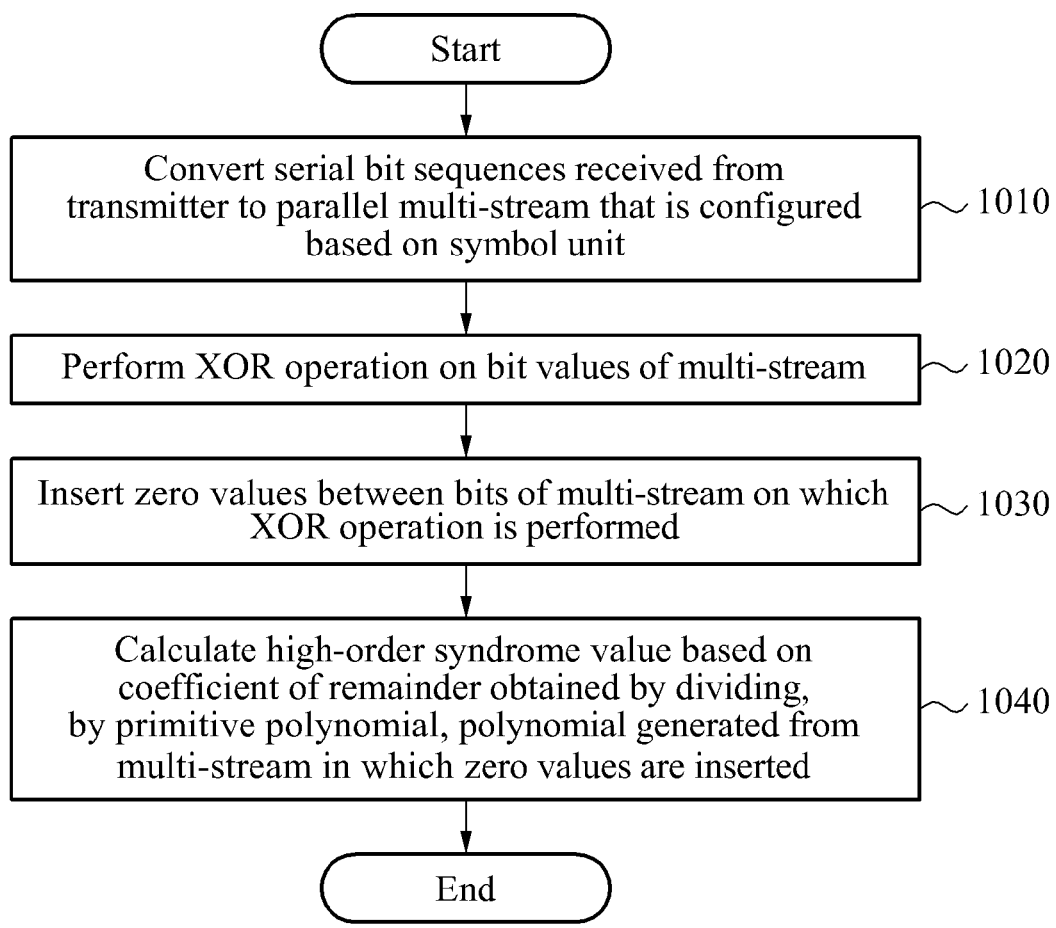
FIG. 10 illustrates another example of a method of calculating a high-order syndrome.

FIG. 10 illustrates another example of a method of calculating a high-order syndrome.

Referring to FIG. 10, in operation 1010, a high-order syndrome calculator (hereinafter, a calculator) converts serial bit sequences received from a transmitter to a parallel multi-stream configured based on a symbol unit. The symbol unit includes a plurality of bits.

In operation 1020, the calculator performs an XOR operation on bit values of the multi-stream based on the symbol unit. In a manner similar to the example of FIG. 5, the XOR operation based on the symbol unit is performed for each bit of a symbol.

In operation 1030, the calculator inserts zero values between the bits of the multi-stream on which the XOR operation is performed.

In operation 1040, the calculator calculates a high-order syndrome value based on a coefficient of a remainder obtained by dividing, by a primitive polynomial, a polynomial generated from the multi-stream in which the zero values are inserted.

FIG. 11 illustrates an example of a table showing a result of comparing a calculation complexity using a conventional syndrome calculation method and a calculation complexity using a high-order syndrome calculation method disclosed in this application.

The table of FIG. 11 shows syndrome calculation results obtained using the conventional syndrome calculation method and the disclosed high-order calculation method with respect to a linear block code (n, k) based on a Galois field $GF(2^m)$, where $n=2^m-1$ is satisfied.

Referring to FIG. 11, it can be known that when calculating a syndrome using the conventional syndrome calculation method, the number of modulo operations is n, and the number of bits in registers for storing information and the number of XOR operations are each m×n. In addition, it can be known that when calculating a syndrome using the conventional syndrome calculation method, the number of LUT function calls for searching for an output value is also n.

In comparison thereto, the disclosed high-order calculation method does not use a storage space of a register for configuring a LUT and does not use a LUT function call for searching for an output value. The disclosed high-order calculation method uses m bits in registers to configure a linear feedback shift register and performs $((L-1)\times(n/L)+ m'\times n)$ XOR operations. m' denotes a number of nonzero coefficients of a primitive polynomial $f(x)-1$.

FIG. 12 illustrates an example of a table showing a result of comparing a calculation complexity using a conventional syndrome calculation method and a calculation complexity using a high-order syndrome calculation method disclosed in this application to calculate $S_3$ when m=6 and $n=2^m-1=63$.

Referring to FIG. 12, it can be known that when calculating a syndrome using the conventional syndrome calculation method, the number of multiplications and the number of modulo operations are each "63", and the number of bits in registers for storing information and the number of XOR operations are each "6×63=378". In addition, it can be known that when calculating a syndrome using the conventional syndrome calculation method, the number of LUT function calls for searching for an output value is also "63".

In comparison thereto, the disclosed high-order calculation method does not use a storage space of a register for configuring a LUT and does not use a LUT function call for searching for an output value. The disclosed high-order calculation method uses 6 bits in registers to configure a linear feedback shift register and performs (42+126=) 168 XOR operations.

The parity bit calculator and the systematic codeword constructor in FIG. 1, the syndrome calculator 210, the error location calculator 230, and the error corrector 250 in FIG. 2, the series-to-parallel converters 510, 610, 710, and 810, the XOR operators 530, 630, 730, and 830, the zero interpolators 550, 650, 750, and 850, and the linear feedback shift registers 570, 670, 770, and 870 in FIGS. 5-8 that perform the various operations described with respect to FIGS. 1, 2, and 5-12 may be implemented using one or more hardware components, one or more software components, or a combination of one or more hardware components and one or more software components.

A hardware component may be, for example, a physical device that physically performs one or more operations, but is not limited thereto. Examples of hardware components include resistors, capacitors, inductors, power supplies, frequency generators, operational amplifiers, power amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

As a non-exhaustive illustration only, a transmitter or a receiver described herein may refer to a mobile device such as a cellular phone, a personal digital assistant (PDA), a digital camera, a portable game console, an MP3 player, a portable/personal multimedia player (PMP), a handheld e-book, a portable laptop PC, a global positioning system (GPS) navigation device, a tablet, or a sensor, or a stationary device such as a desktop PC, a high definition television (HDTV), an optical disc player, a set-top box, or a home appliance, or any other device known to one of ordinary skill in the art that is capable of wireless communication or network communication consistent with that which is disclosed herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A high-order syndrome calculator comprising:
   a serial-to-parallel converter configured to convert serial bit sequences received from a transmitter to a parallel multi-stream;
   an exclusive OR (XOR) operator configured to perform an XOR operation on bit values of the parallel multi-stream;
   a zero interpolator configured to insert zero values between the bit values on which the XOR operation is performed; and
   a linear feedback shift register configured to calculate a high-order syndrome value based on a coefficient of a remainder obtained by dividing, by a primitive polynomial, a polynomial generated from the parallel multi-stream in which the zero values are inserted.

2. The high-order syndrome calculator of claim 1, wherein the serial-to-parallel converter is further configured to convert the received serial bit sequences to an L-bit multi-stream, L denoting a natural number satisfying L≥1, by delaying the received serial bit sequences by integer multiples of a predetermined number of bits satisfying the equation D =n/j, where D denotes the predetermined number of bits, n denotes a block size of a block code, j denotes a syndrome order to be calculated, and n/j denotes an integer.

3. The high-order syndrome calculator of claim 2, wherein the serial-to-parallel converter comprises (L−1) delay elements, and is further configured to output a bit sequence as a first bit of the multi-stream without delaying the bit sequence, and output the bit sequence as an $L^{th}$ bit of the multi-stream after delaying the bit sequence by (L−1) ×D bits.

4. The high-order syndrome calculator of claim 2, wherein the serial-to-parallel converter is further configured to output the received serial bit sequences to the zero interpolator without delaying the received serial bit sequences in response to a value of n/j not being an integer.

5. The high-order syndrome calculator of claim 4, wherein the zero interpolator is further configured to periodically insert N (=j−1) zero values between the bit values of the parallel multi-stream on which the XOR operation is performed in response to the value of n/j not being an integer.

6. The high-order syndrome calculator of claim 1, wherein the zero interpolator is further configured to periodically insert N (=L−1) zero values between the bit values of the parallel multi-stream on which the XOR operation is performed.

7. A high-order syndrome calculator comprising:
a serial-to-parallel converter configured to convert serial bit sequences received from a transmitter to a parallel multi-stream configured based on a symbol unit, wherein the symbol unit comprises a plurality of bits;
an exclusive OR (XOR) operator configured to perform an XOR operation on bit values of the parallel multi-stream based on the symbol unit;
a zero interpolator configured to insert zero values between the bit values of the parallel multi-stream on which the XOR operation is performed; and
a linear feedback shift register configured to calculate a high-order syndrome value based on a coefficient of a remainder obtained by dividing, by a primitive polynomial, a polynomial generated from the parallel multi-stream in which the zero values are inserted.

8. The high-order syndrome calculator of claim 7, wherein the serial-to-parallel converter is further configured to convert the received serial bit sequences to a (symbol unit ×L)-bit multi-stream, L denoting a natural number satisfying L≥1, by delaying the received serial bit sequences by integer multiples of a predetermined number of bits satisfying the equation D =n/j, where D denotes the predetermined number of bits, n denotes a block size of a block code, j denotes a syndrome order to be calculated, and n/j denotes an integer.

9. The high-order syndrome calculator of claim 8, wherein the serial-to-parallel converter is further configured to output the received serial bit sequences to the zero interpolator without delaying the received serial bit sequences in response to a value of n/j not being an integer.

10. The high-order syndrome calculator of claim 9, wherein the zero interpolator is further configured to periodically insert N (=j−1) zero values of the symbol unit between the bit values of the parallel multi-stream on which the XOR operation is performed in response to the value of n/j not being an integer.

11. The high-order syndrome calculator of claim 7, wherein the zero interpolator is further configured to periodically insert N (=L−1) zero values of the symbol unit between the bit values of the parallel multi-stream on which the XOR operation is performed.

12. A method of calculating a high-order syndrome, the method comprising:
converting serial bit sequences received from a transmitter to a parallel multi-stream;
performing an exclusive OR (XOR) operation on bit values of the parallel multi-stream;
inserting zero values between the bit values on which the XOR operation is performed; and
calculating a high-order syndrome value based on a coefficient of a remainder obtained by dividing, by a primitive polynomial, a polynomial generated from the parallel multi-stream in which the zero values are inserted.

13. A non-transitory computer-readable storage medium storing a program comprising instructions to control a computer to perform the method of claim 12.

14. A method of calculating a high-order syndrome, the method comprising:
converting serial bit sequences received from a transmitter to a parallel multi-stream configured based on a symbol unit, wherein the symbol unit comprises a plurality of bits;
performing an exclusive OR (XOR) operation on bit values of the parallel multi-stream based on the symbol unit;
inserting zero values between the bit values of the parallel multi-stream on which the XOR operation is performed; and
calculating a high-order syndrome value based on a coefficient of a remainder obtained by dividing, by a primitive polynomial, a polynomial generated from the parallel multi-stream in which the zero values are inserted.

15. A non-transitory computer-readable storage medium storing a program comprising instructions to control a computer to perform the method of claim 14.

* * * * *